(12) United States Patent
Jung

(10) Patent No.: US 6,537,863 B1
(45) Date of Patent: Mar. 25, 2003

(54) LASER BEAM SCANNING METHOD

(75) Inventor: Yun-Ho Jung, Seoul (KR)

(73) Assignee: LG Philips LCD Co., LTD (KR)

( * ) Notice: Subject to any disclaimer, the term of this patent is extended or adjusted under 35 U.S.C. 154(b) by 0 days.

(21) Appl. No.: 09/212,709

(22) Filed: Dec. 16, 1998

(30) Foreign Application Priority Data

Dec. 30, 1997 (KR) .......................................... 97-78779

(51) Int. Cl.⁷ .............................................. H01L 21/00
(52) U.S. Cl. ..................................................... 438/166
(58) Field of Search ................................ 438/166, 308, 438/795, 427, 554, 487

(56) References Cited

U.S. PATENT DOCUMENTS

| | | | |
|---|---|---|---|
| 5,432,122 A | | 7/1995 | Chae .......................... 437/101 |
| 5,858,822 A | * | 1/1999 | Yamazaki ................... 438/166 |
| 5,960,323 A | * | 9/1999 | Wakita |
| 6,038,075 A | * | 3/2000 | Yamakazi ................... 359/626 |
| 6,066,516 A | * | 5/2000 | Miyasaka ................... 438/149 |
| 6,074,901 A | * | 6/2000 | Ohtani ........................ 438/166 |
| 6,242,292 B1 | * | 6/2001 | Yamakazi ................... 438/166 |
| 6,274,414 B1 | * | 8/2001 | Ogata .......................... 438/166 |
| 6,291,320 B1 | * | 9/2001 | Yamazaki ................... 438/487 |

* cited by examiner

*Primary Examiner*—John F. Niebling
*Assistant Examiner*—Stacy A Whitmore
(74) *Attorney, Agent, or Firm*—McKenna Long & Aldridge LLP

(57) ABSTRACT

A laser beam scanning method for irradiating a large-area silicon film with a laser beam by scanning the beam two or more times across the film to provide laser energy to the entire film. The laser beam has an elongated shape and a energy profile in the longitudinal direction which is substantially flat and has an energy slope region at each end portion of the energy profile. Between two successive scans, the laser beam is displaced with respect to the film in the direction perpendicular to the scan, where the two beams spatially overlap in the energy slope regions to supply the substrate with spatially uniform laser energy density.

29 Claims, 4 Drawing Sheets

US 6,537,863 B1

LASER BEAM SCANNING METHOD

BACKGROUND OF THE INVENTION

1. Field of the Invention

The present invention relates to a laser beam scanning method for laser activation and crystallization for a thin film transistor substrate in a large area-liquid crystal display.

2. Discussion of the Related Art

Laser beam scanning is used to recover or recrystallize a part of a polycrystalline silicon layer which becomes amorphous due to doping with ions, or to crystallize an amorphous silicon layer.

In general, these processes (referred to as activation of the silicon layer using laser) proceeds by supplying a surface of the layer with laser energy by scanning the layer repeatedly with a laser beam having predetermined spatial and energy profiles.

FIG. 1 shows schematically laser scanning according to a technique of the related art. FIG. 2 shows schematically the spatial profile 21 and the energy profile 22 of the laser beam in the length direction of the spatial profile. The laser beam 13 which has an elongated spatial profile 21 is generated by a laser equipment known in the art. The energy profile 22 of the laser beam is substantially flat along the entire length of the beam and has an elongated step shape with steep edges.

Referring to FIG. 1, laser scanning is carried out by irradiating a thin film 10, such as an amorphous silicon film, with the laser beam 13 at a predetermined repetition rate and translating the thin film 10, thereby scanning the whole surface of the thin film. The translating direction of the thin film is opposite to the scanning direction of the laser beam.

However, the length of the laser beam generated by known laser equipment has an upper limit. Typically, the length of the laser beam is about 200–300 mm with a width of about 0.3–2.0 mm. Therefore, when scanning a large area silicon film that is wider than the length of the laser beam, the entire surface of a large area film cannot be irradiated with a single scanning of the laser beam. An example of such a large area film is a wide vision LCD panel having a diagonal dimension of 12.1 inches or more.

SUMMARY OF THE INVENTION

Accordingly, the present invention is directed to a laser beam scanning method that substantially obviates one or more of the problems due to limitations and disadvantages of the related art.

The object of the present invention is to provide a laser beam scanning method which supplies a large area substrate with uniform laser energy.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention provides a laser beam scanning method, wherein the laser beam has a spatial profile of an elongated rectangular shape and a substantially flat energy profile, the end portions of the energy profile having energy slope regions, the energy slope being defined by the ratio of the laser energy density to the width of the slope region.

Another aspect of the present invention provides a laser beam scanning method, in which a large-area film is irradiated by a laser beam scanning across the film two or more times, to provide laser energy to the whole large-area film, the laser beam being displaced relative to the film in a direction perpendicular to the scan direction before each subsequent scan. The laser beam has a spatial profile having an elongated rectangular shape along an longitudinal axis, and a substantially flat energy profile along the longitudinal axis, where the end portions of the energy profile have energy slope regions, the energy slope being defined by the ratio of the laser energy density and the width of the slope region. The energy slope regions of the successive laser beams are selectively overlapped to supply the substrate with uniform laser energy.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate embodiments of the inventing and together with the description serve to explain the principle of the invention.

Figure 6:
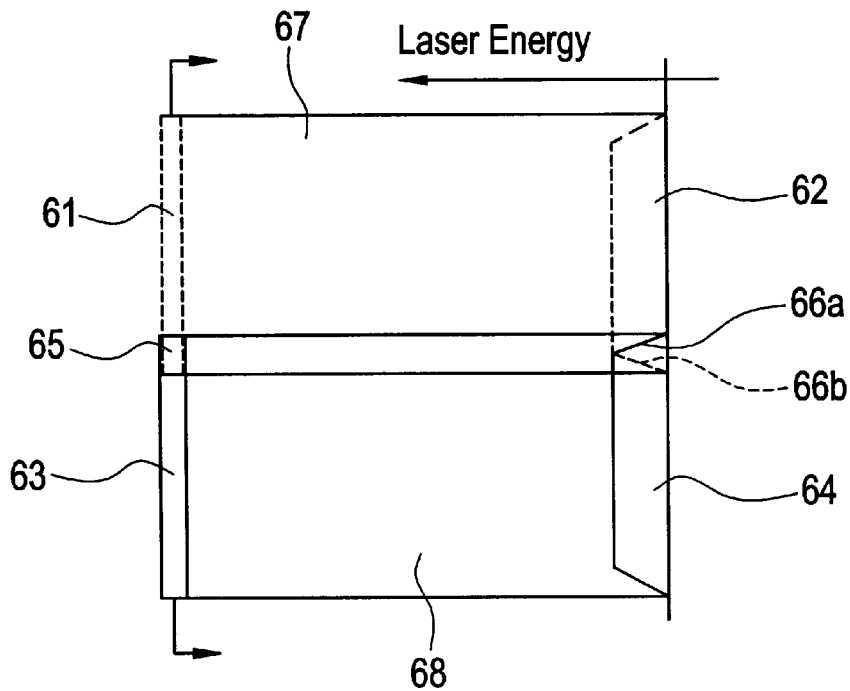

FIG. 6 is a schematic drawing showing the laser energy distribution of a laser beam overlapping region during laser beam scanning according to a second embodiment of the present invention; and FIGS. 7A to 7D are schematic drawings showing the laser energy distribution of a laser beam overlapping region during laser beam scanning according to a third, a fourth, a fifth and a sixth embodiments of the present invention;

DETAILED DESCRIPTION OF PREFERRED EMBODIMENTS

Reference will now be made in detail to the preferred embodiment of the present invention, an example of which is illustrated in the accompanying drawings.

Figure 1:
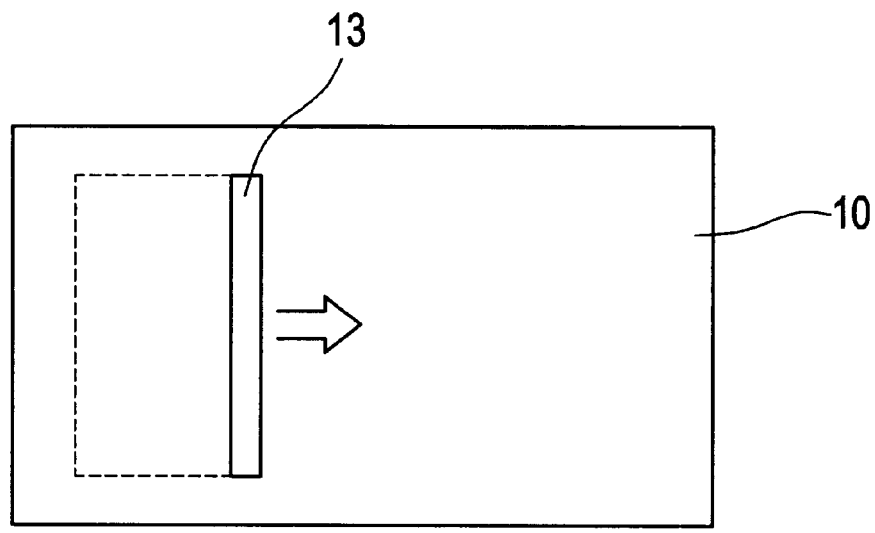
FIG. 1 is a schematic drawing showing laser scanning according to related art.
Figure 2:
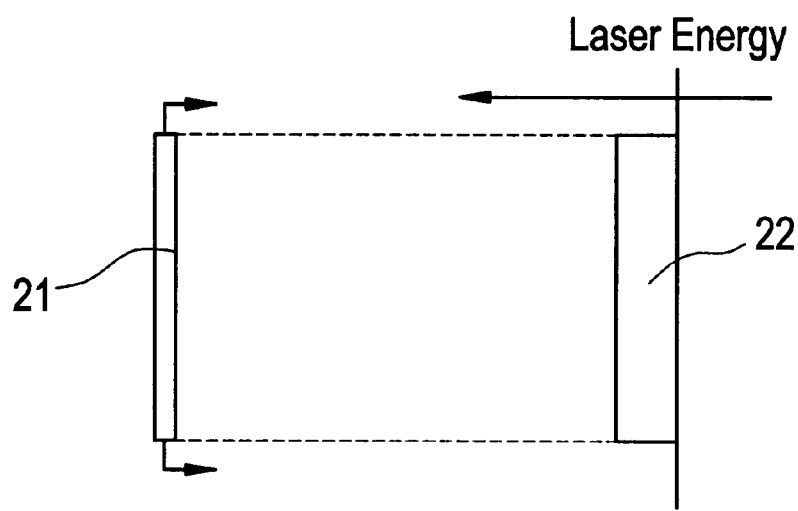
FIG. 2 is a schematic drawing showing a spatial profile and an energy profile of a laser beam.
Figure 3:
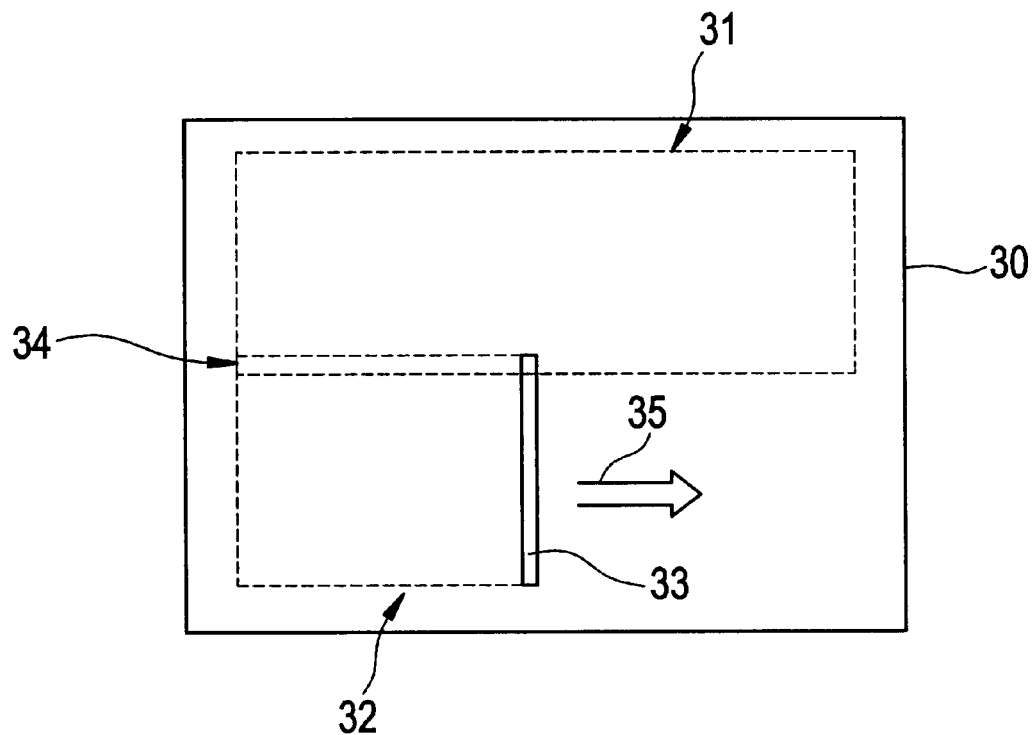
FIG. 3 is a drawing showing laser scanning method according to an embodiment of the present invention.

FIG. 3 is a drawing showing laser scanning according to a first embodiment of the present invention. FIG. 3 shows an overlapped portions of laser beams when a large area-film 30 is scanned by a laser beam 33. The large area film or substrate 30 is irradiated by the laser beam scanning across the film 30 two times (or more than two times if necessary to cover the entire film), including a first scan 31 and a second scan 32, to provide laser energy to the entire large-area film 30. For the second scan 32, the laser beam 33 is displaced with respect to the film 30 in the direction perpendicular to the scan direction (indicated by the arrow 35)

by a distance less than the length of the laser beam. As a result, the laser beam for the first and second scans overlaps in an area 34. Such overlap of the laser beams can cause voids and other problems in the film 30.

When displacing the laser beam with respect to the film, either one of the laser beam and the film may be physically displaced while the other one stays stationary. When two laser beams are said to overlap in an area, such as the area 34, what is meant is that the area 34 of the film is irradiated by both laser beams. In particular, when a first portion of a first laser beam is said to overlap a second portion of a second laser beam in an area, what is meant is that that area of the film is irradiated by both the first portion of the first laser beam and the second portion of the second laser beam.

Figure 4:
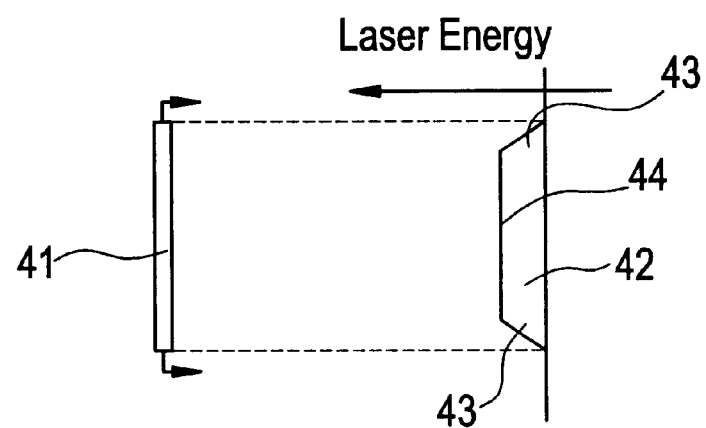
FIG. 4 is a schematic drawing showing a spatial profile and an energy profile of a first laser beam according to an embodiment of the present invention.

FIG. 4 shows schematically a spatial profile 41 and an energy profile 42 of the laser beam according to an embodiment of the present invention. The spatial profile 41 of the laser beam has an elongated rectangular shape defining an longitudinal axis perpendicular to the direction of the scan. The energy profile 42 of the laser beam is substantially flat in the region 44 over the entire length of the beam except at each end portion of the laser beam, where the energy profile define energy slope regions 43. The energy density slope in the regions 43 can be controlled by manipulating the laser equipment, such as filters and lenses, and is preferably linear. Wherein the end portions of the laser beam has slope angle below 90 degrees, preferably, about 45 degrees.

Figure 5:
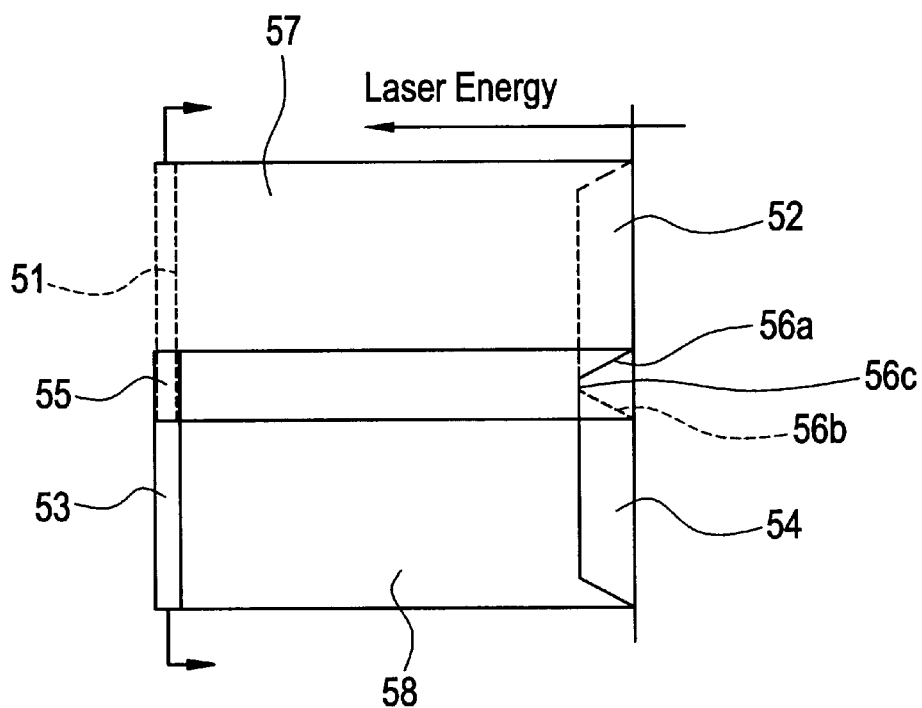
FIG. 5 is a schematic drawing showing the laser energy distribution of a laser beam overlapping region during laser beam scanning according to a first embodiment of the present invention.

FIG. 5 shows schematically the laser energy distribution of a laser beam overlapping region during a laser beam scanning according to a first embodiment of the present invention. As described above, a large area film is scanned by the laser beam two times (or more than two times if necessary to cover the entire film), including a first scan 57 and a second scan 58 to provide laser energy to the entire large area film. The dotted lines show a spatial profile 51 and an energy profile 52 of the laser beam in the first scan, and the solid lines show a spatial profile 53 and energy profile 54 of the laser beam in the second scan.

The two laser scans 57 and 58 overlap in an area 55. The width of the overlapping region is determined by the displacement of the laser beam relative to the film before the second scan. In the embodiment of FIG. 5, the overlapping region 55 includes both the energy slope regions 56a and 56b of the first and second laser beams, as well as a portion 56c of the flat energy region of each beam adjacent the respective energy slope region.

FIG. 6 shows schematically the laser energy distribution of a laser beam overlapping region during a laser beam scanning according to a second embodiment of the present invention. Again, a large area film is scanned by the laser beam two times (or more than two times if necessary to cover the entire film), including a first scan 67 and a second scan 68, to provide laser energy to the entire large area film. The dotted line shows a spatial profile 61 and an energy profile 62 of the laser beam in the first scan, and the full line shows a spatial profile 63 and an energy profile 64 of the laser beam in the second scan.

The two laser scans 67 and 68 overlap in an area 65. In this embodiment, the energy slope regions 66a and 66b of the respective laser beams overlap completely. In addition, only the energy slope regions 66a and 66b overlap, and no portion of the flat regions overlap. As a result, the total laser energy density received in the overlapping region 65 is a constant and is the same as that received in other regions which are irradiated once by the flat energy portion of the laser beam. This allows spatially uniform laser energy to be supplied to the entire substrate.

Spatial uniformity in the irradiation energy is important for laser activation, as both insufficient and excess laser energy may cause defects in the silicon layer formed. When the method of the present invention is applied to laser annealing of an active layer after doping, the impurity regions of the active layer where activation occurs receive laser energy uniformly, and activation proceeds uniformly. This enhances uniformity of the thin film transistors formed in the substrate.

FIGS. 7A to 7D are schematic drawings showing the laser energy distribution of a laser beam overlapping region during laser beam scanning according to a third, a fourth, a fifth and a sixth embodiments of the present invention.

In these four embodiments of the present invention, a first laser beam having a first energy profile and a second laser beam having a second energy profile. The first energy profile is substantially flat over the entire length of the beam except at least one of the edge portions which is called energy slop region. And, the second energy profile is substantially flat along the entire length of the beam and has an elongated step shape with steep edges.

In these four embodiments of the present invention, the solid lines show an energy profile of the laser beam in the first scan and the dotted lines show an energy profile of the laser beam in the second scan.

Figure 7A:
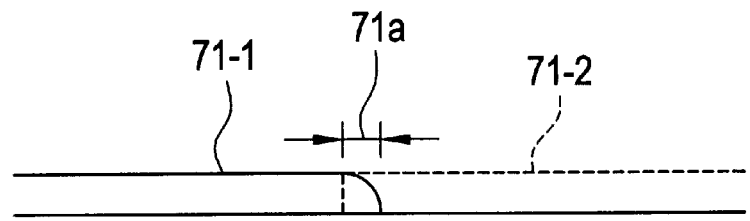

Referring to FIG. 7A a large area film is scanned by the laser beam two times including a first scan 71-1 with the first laser beam having the first energy profile and a second scan 71-2 with the second laser beam. Having a second energy profile. Only the energy slop region of the first laser beam in the first scan 71-1 overlaps the second laser beam in the second scan 71-2 . Accordingly, the total laser energy density received in the overlapping region 71a is a constant and is the same as that received in other regions.

Figure 7B:
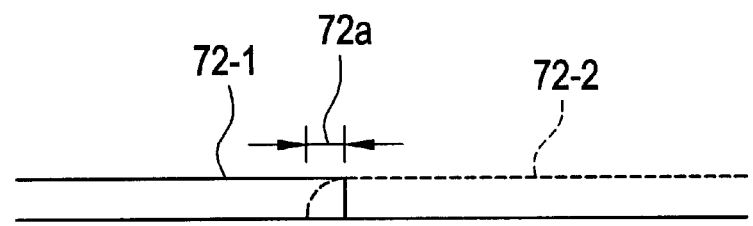

Referring to FIG. 7B a large area film is scanned by the laser beam two times including a first scan 72-1 with the second laser beam having the second energy profile and a second scan 71-2 with the first laser beam having the first energy profile. Only the energy slop region of the first laser beam in the second scan 71-2 overlaps the first laser beam in the first scan 72-1. Accordingly, the total laser energy density received in the overlapping region 72a is a constant and is the same as that received in other regions.

Figure 7C:
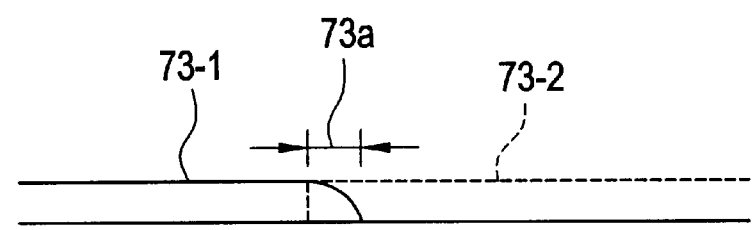

Referring to FIG. 7C, a large area film is scanned by the laser beam two times including a first scan 73-1 with the first laser beam having the first energy profile and a second scan 73-2 with the second laser beam having the second energy profile. The two laser scans 73-1 and 73-2 overlap in an area 73a. Both the energy slop region and a portion of the flat energy region adjacent the energy slop region of the first laser beam in the first laser scan 73-1 overlap the second laser beam in the second scan 73-2.

Figure 7D:
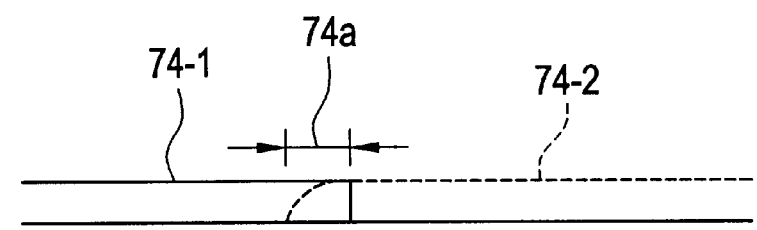

Referring to FIG. 7D, a large area film is scanned by the laser beam two times including a first scan 74-1 with the second laser beam having the second energy profile and a second scan 74-2 with the first laser beam having the first energy profile. The two laser scans 74-1 and 74-2 overlap in an area 74a. Both the energy slop region and a portion of the flat energy region adjacent the energy slop region of the first laser beam in the second laser scan 74-2 overlap the second laser beam in the first scan 74-1

When the method of the present invention is applied in crystallizing an amorphous silicon layer, regions of discontinuity in crystallization are reduced or eliminated because laser energy is distributed uniformly to crystallize the entire amorphous silicon layer. Uniform crystallization of the entire layer is therefore achieved.

It will be apparent to those skilled in the art that various modifications and variations can be made in a laser irradiation method of the present invention without departing from the spirit or scope of the inventions. Thus, it is intended that the present invention cover the modifications and variations of this invention provided they come within the scope of the appended claims and equivalents.

What is claimed is:

1. A method of irradiating a silicon layer, comprising the steps of:
   providing a laser beam having an elongated spatial profile defining a longitudinal direction, the laser beam further defining an energy profile in the longitudinal direction having a substantially flat portion and an energy slope region at each end of the energy profile;
   scanning the laser beam across the silicon layer in a direction perpendicular to the longitudinal direction;
   displacing the laser beam with respect to the silicon layer in the longitudinal direction so that an end portion of the laser beam after the displacement overlaps an end portion of the laser beam before the displacement; and
   scanning the displaced laser beam across the silicon layer in the direction perpendicular to the longitudinal direction.

2. The method of claim 1, wherein one of the energy slope regions of the laser beam before the displacement overlaps one of the energy slope regions of the laser beam after the displacement, and wherein the flat region of each laser beam is free from overlapping with the other laser beam.

3. The method of claim 1, wherein a portion of the laser beam including an energy slope region and a flat region before the displacement overlaps a portion of the laser beam including an energy slope region and a flat region after the displacement.

4. The method of claim 1, wherein the energy profile in each energy slope region is linear.

5. The method of claim 1, wherein the silicon layer is a polycrystalline silicon layer which becomes amorphous when doped with impurities.

6. The method of claim 1, wherein the laser scanning activates the silicon layer to form an active layer of a thin film transistor.

7. The method of claim 1, wherein the silicon layer is an amorphous silicon layer.

8. The method of claim 7, wherein the laser scanning crystallizes the silicon layer.

9. A method of irradiating a layered material, comprising the steps of:
   providing a laser beam having an elongated spatial profile defining a longitudinal direction, the laser beam further defining an energy profile in the longitudinal direction having a substantially flat energy region and a sloped energy region at each end of the energy profile;
   first scanning the laser beam across the layered material in a direction perpendicular to the longitudinal direction;
   displacing the laser beam with respect to the layered material in the longitudinal direction so that an end portion of the laser beam after the displacement at least partially overlaps an end portion having the sloped energy region of the laser beam before the displacement; and
   second scanning the displaced laser beam across the layered material in the direction perpendicular to the longitudinal direction.

10. The method of claim 9, wherein one of the sloped energy regions of the laser beam before the displacement overlaps one of the sloped energy regions of the laser beam after the displacement, and wherein the flat energy region of the laser beam during the first scanning does not overlap with the flat energy region of the laser beam during the second scanning.

11. The method of claim 9, wherein one of the sloped energy regions of the laser beam before the displacement overlaps one of the sloped energy regions of the laser beam after the displacement, and wherein the flat energy region of the laser beam during the first scanning partially overlaps with the flat energy region of the laser beam during the second scanning.

12. The method of claim 9, wherein the energy profile in each sloped energy region is linear.

13. The method of claim 9, wherein the silicon layer is a polycrystalline silicon layer which becomes amorphous when doped with impurities.

14. The method of claim 9, wherein the laser scanning activates the silicon layer to form an active layer of a thin film transistor.

15. The method of claim 9, wherein the silicon layer is an amorphous silicon layer.

16. The method of claim 15, wherein the laser scanning crystallizes the silicon layer.

17. A product manufactured by the process of claim 13.

18. A method of irradiating a film, comprising the steps of:
   providing a first laser beam having a first energy profile, the first energy profile being substantially flat over the entire length of the beam except at least one of energy slope regions at each end of the first energy profile;
   providing a second laser beam having a second energy profile, the second energy profile being substantially flat along the entire length of the beam and has an elongated step shape with steep edges;
   first-scanning the laser one of the first laser beam and the second laser beam across the film; and
   second-scanning the laser the other of the first laser beam and the second laser beam across the film.

19. The method of claim 18, wherein the energy slop region of the first enegy profile of the first laser beam overlaps the second energy profile of the second laser beam.

20. The method of claim 18, wherein the energy slop region of the first enegy profile of the first laser beam overlaps the second energy profile of the second laser beam.

21. The method of claim 1, wherein the laser beam has a width between about 0.3 mm and 2.0 mm.

22. The method of claim 1, wherein providing the laser beam having the elongated spatial profile includes producing an energy slope region having a slope less than 90 degrees at each end of an energy profile.

23. The method of claim 1, wherein providing the laser beam having the elongated spatial profile includes producing an energy slope region having a slope of about 45 degrees at each end of an energy profile.

24. The method of claim 9, wherein the laser beam has a width between about 0.3 mm and 2.0 mm.

25. The method of claim 9, wherein providing the laser beam having the elongated spatial profile includes producing an energy slope region having a slope less than 90 degrees at each end of an energy profile.

26. The method of claim 9, wherein providing the laser beam having the elongated spatial profile includes producing an energy slope region having a slope of about 45 degrees at each end of an energy profile.

27. The method of claim 18, wherein the first laser beam has a width between about 0.3 mm and 2.0 mm.

28. The method of claim 18, wherein providing the first laser beam having the first energy profile includes producing an energy slope region having a slope less than 90 degrees at each end of an energy profile.

29. The method of claim 18, wherein providing the first laser beam having the first energy profile includes producing an energy slope region having a slope of about 45 degrees at each end of an energy profile.

* * * * *